(12) United States Patent
Ding et al.

(10) Patent No.: US 11,489,026 B2
(45) Date of Patent: Nov. 1, 2022

(54) DISPLAY PANEL, METHOD OF MANUFACTURING DISPLAY PANEL, AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Wang Ding, Beijing (CN); Chuanyou He, Beijing (CN); Chenxing Wan, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 94 days.

(21) Appl. No.: 16/910,678

(22) Filed: Jun. 24, 2020

(65) Prior Publication Data
US 2020/0411615 A1   Dec. 31, 2020

(30) Foreign Application Priority Data
Jun. 27, 2019  (CN) .......................... 201910570475.7

(51) Int. Cl.
  *H01L 27/32* (2006.01)
  *H01L 51/52* (2006.01)
  *H01L 51/56* (2006.01)

(52) U.S. Cl.
  CPC ...... *H01L 27/3246* (2013.01); *H01L 51/5253* (2013.01); *H01L 51/56* (2013.01)

(58) Field of Classification Search
  CPC .............. H01L 27/3246; H01L 51/56; H01L 51/5253–5256
  See application file for complete search history.

(56) References Cited

U.S. PATENT DOCUMENTS

| | | | |
|---|---|---|---|
| 2015/0380685 A1* | 12/2015 | Lee | ...................... H01L 51/5237 257/40 |
| 2016/0260928 A1* | 9/2016 | Choi | .................... H01L 51/5253 |

(Continued)

FOREIGN PATENT DOCUMENTS

| | | |
|---|---|---|
| CN | 106601781 A | 4/2017 |
| CN | 207116481 U | 3/2018 |

(Continued)

OTHER PUBLICATIONS

Office Action dated Jan. 14, 2021, issued in counterpart CN Application No. 201910570475.7, with English Translation. (24 pages).

*Primary Examiner* — Shaun M Campbell
(74) *Attorney, Agent, or Firm* — WHDA, LLP

(57) ABSTRACT

Embodiments of the present disclosure provide a display panel, a method of manufacturing the display panel, and a display apparatus with the display panel. The display panel includes: a substrate including a display area and a non-display area around the display area; at least one dam disposed in the non-display area of the substrate and having an undulated structure on a surface of the dam facing away from the substrate; and an encapsulation layer disposed on a side of the dam facing away from the substrate.

13 Claims, 4 Drawing Sheets

(56) References Cited

U.S. PATENT DOCUMENTS

| | | | |
|---|---|---|---|
| 2017/0069873 A1 | 3/2017 | Kim et al. | |
| 2019/0280246 A1 | 9/2019 | Cheng | |
| 2020/0052245 A1* | 2/2020 | Qiao | H01L 27/3246 |
| 2020/0220097 A1 | 7/2020 | Song et al. | |
| 2020/0388784 A1* | 12/2020 | Kim | H01L 51/56 |
| 2021/0226162 A1* | 7/2021 | Qian | H01L 51/56 |

FOREIGN PATENT DOCUMENTS

| | | | |
|---|---|---|---|
| CN | 109037289 A | 12/2018 | |
| CN | 109037480 A | 12/2018 | |
| CN | 109728200 A | 5/2019 | |
| WO | WO-2019114699 A1 * | 6/2019 | H01L 51/5253 |

\* cited by examiner

DISPLAY PANEL, METHOD OF MANUFACTURING DISPLAY PANEL, AND DISPLAY APPARATUS

CROSS-REFERENCE TO RELATED APPLICATION

This application claims priority to Chinese Patent Application No. 201910570475.7 filed on Jun. 27, 2019, which is incorporated herein by reference in its entirety.

TECHNICAL FIELD

Embodiments of the present disclosure relate to the field of display technology, and particularly to a display panel, a method of manufacturing the display panel, and a display apparatus.

BACKGROUND

When manufacturing an organic light emitting diode (OLED) display panel, firstly, a barrier dam needs to be manufactured in a non-display area of a substrate to prevent an organic light emitting material from overflowing from a display area when printing an organic light emitting layer with the organic light emitting material in the display area, and then, an encapsulation layer covering the barrier dam is manufactured to prevent water and oxygen from eroding the display area.

SUMMARY

Embodiments of the present disclosure provide a display panel including: a substrate including a display area and a non-display area around the display area; at least one dam disposed in the non-display area of the substrate and having an undulated structure on a surface of the dam facing away from the substrate; and an encapsulation layer disposed on a side of the dam facing away from the substrate.

According to embodiments of the present disclosure, the undulated structure includes at least one of a recessed structure or a protruded structure.

According to embodiments of the present disclosure, the undulated structure has a curve shape or a broken line shape in a width direction of the dam.

According to embodiments of the present disclosure, the dam includes a pixel defining layer and a supporting layer disposed on a side of the pixel defining layer facing away from the substrate.

According to embodiments of the present disclosure, the supporting layer includes: a first surface facing away from the substrate, and a second surface facing towards the substrate, and the undulated structure is disposed on the first surface of the supporting layer.

According to embodiments of the present disclosure, the supporting layer includes a sidewall, a portion of the sidewall adjacent to the first surface has a preset slope angle, and an orthogonal projection of the first surface on the substrate is located within an orthogonal projection of the second surface on the substrate.

According to embodiments of the present disclosure, the supporting layer has a thickness of 1.5 μm to 2 μm in a direction perpendicular to the substrate.

According to embodiments of the present disclosure, the at least one dam includes a first dam and a second dam, and the first dam is located between the second dam and the display area; and the substrate includes a surface facing away from the dam, and in a direction perpendicular to the substrate, and a distance between the first surface of the supporting layer of the first dam and the surface of the substrate is less than a distance between the first surface of the supporting layer of the second dam and the surface of the substrate.

According to embodiments of the present disclosure, the substrate includes: a base substrate, an interlayer dielectric layer disposed on the base substrate; a metal layer and a planarization layer which are disposed in a same layer on a side of the interlayer dielectric layer facing away from the base substrate; and an anode disposed on a side of the metal layer facing away from the base substrate and partially covering the planarization layer; and the pixel defining layer of the first dam is located on a side of the anode facing away from the base substrate, and the pixel defining layer of the second dam is located on a side of the planarization layer and the anode facing away from the base substrate.

According to embodiments of the present disclosure, the at least one dam includes a plurality of dam disposed in the non-display area of the substrate, and undulated structures of the plurality of dams have a same shape.

According to embodiments of the present disclosure, the undulated structure includes: a plurality of recessed structures arranged at equal intervals and having a same shape; and a plurality of protruded structures arranged at equal intervals and having a same shape.

According to embodiments of the present disclosure, the encapsulation layer includes at least one inorganic film.

According to embodiments of the present disclosure, the at least one dam defines a plurality of pixels arranged in an array and located in the display area for displaying an image.

Embodiments of the present disclosure further provide a method of manufacturing a display panel, the method including: providing a substrate, the substrate including a display area and a non-display area around the display area; forming at least one dam in the non-display area of the substrate, the dam having an undulated structure on a surface of the dam facing away from the substrate; and forming an encapsulation layer on a side of the dam facing away from the substrate.

According to embodiments of the present disclosure, the dam includes a pixel defining layer and a supporting layer, forming the at least one dam in the non-display area of the substrate includes: forming the pixel defining layer in the non-display area of the substrate; and forming the supporting layer on a side of the pixel defining layer facing away from the substrate, and the supporting layer includes: a first surface facing away from the substrate, and a second surface facing towards the substrate, and the undulated structure is disposed on the first surface of the supporting layer.

According to embodiments of the present disclosure, forming the supporting layer on the side of the pixel defining layer facing away from the substrate includes: forming a film for the supporting layer on the side of the pixel defining layer facing away from the substrate, and patterning the film for the supporting layer with a half-tone mask to obtain the supporting layer.

According to embodiments of the present disclosure, the supporting layer includes a sidewall, a portion of the sidewall adjacent to the first surface has a preset slope angle, and an orthogonal projection of the first surface on the substrate is located within an orthogonal projection of the second surface on the substrate.

According to embodiments of the present disclosure, the undulated structure includes at least one of a recessed structure or a protruded structure.

According to embodiments of the present disclosure, the undulated structure has a curve shape or a broken line shape in a width direction of the dam.

Embodiments of the present disclosure further provide a display apparatus including the above display panel.

DETAILED DESCRIPTION

In order that the objects, advantages, and features of the present disclosure become more apparent and are more readily appreciated, a further description of the present disclosure will be made as below with reference to embodiments of the present disclosure taken in conjunction with the accompanying drawings.

Figure 1:
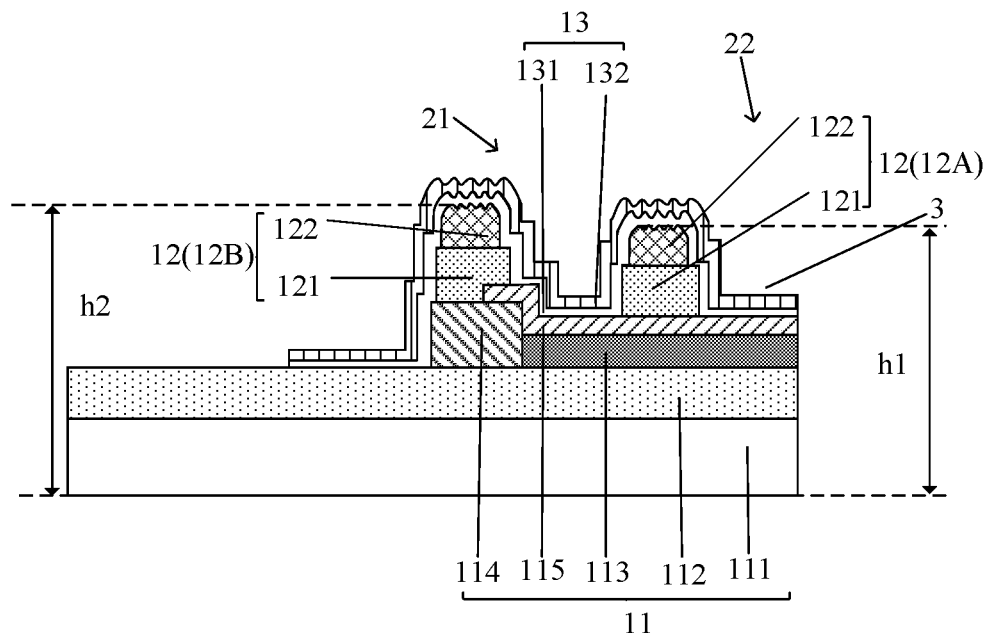
FIG. 1 is a schematic view showing a structure of a display panel according to an embodiment of the present disclosure.
Figure 2:
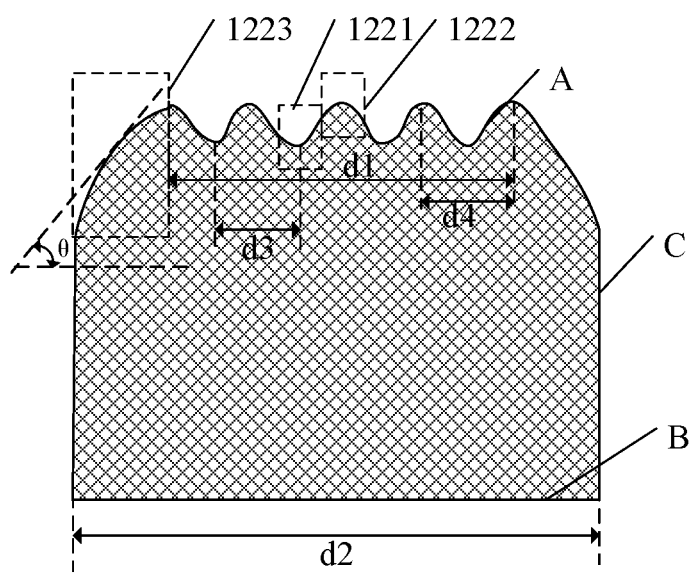
FIG. 2 is a partial enlarged schematic view of a supporting layer of the display panel shown in FIG. 1.
Figure 3:
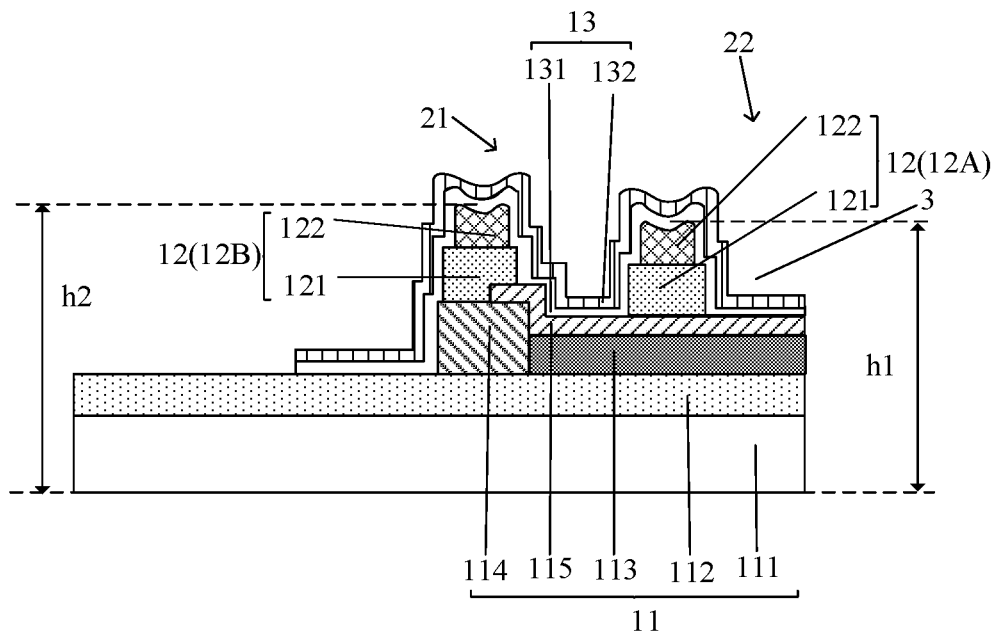
FIG. 3 is a schematic view showing a structure of a display panel according to another embodiment of the present disclosure.

FIG. 1 is a schematic view showing a structure of a display panel according to an embodiment of the present disclosure, FIG. 2 is a partial enlarged schematic view of the display panel shown in FIG. 1, and FIG. 3 is a schematic view showing a structure of a display panel according to another embodiment of the present disclosure.

Referring to FIGS. 1 to 3, embodiments of the present disclosure provide a display panel. The display panel includes: a substrate 11 including a display area 22 and a non-display area 21 around the display area 22; at least one dam 12 disposed in the non-display area 21 of the substrate 11 and having an undulated structure on a surface of the dam 12 facing away from the substrate 11; and an encapsulation layer 13 disposed on a side of the dam 12 facing away from the substrate 11. The at least one dam defines a plurality of pixels 3 arranged in an array and located in the display area 22 for displaying an image.

It is to be noted that FIGS. 1 and 3 show only the schematic views of the structure of the display panel in the non-display area. The display area of the display panel is mainly provided with a plurality of pixel units arranged in an array and a pixel driving circuit for driving the pixel units for display. Each pixel unit includes an anode, a cathode, and an organic light emitting layer between the anode and the cathode. Moreover, the pixel driving circuit is connected to the anodes of the pixel units. The structure of the display area of the display panel will not be described in detail in the embodiments of the present disclosure.

Since an organic light emitting layer is usually printed with a liquid organic light emitting material in the display area, at least one dam 12 needs to be formed in the non-display area of the substrate 11 in order to prevent the liquid organic light emitting material from overflowing from the display area.

The dam 12 has the undulated structure on the surface of the dam 12 facing away from the substrate 11. A dam of an existing display panel has a planar structure on a surface of the dam facing away from a substrate. The surface of the dam 12 facing away from the substrate 11 in the embodiments of the present disclosure has a greater actual length than the surface of the dam of the existing display panel. Thereby, the encapsulation layer 13 formed on the side of the dam 12 facing away from the substrate 11 also has an increased effective length. Therefore, a path to be eroded by water and oxygen can be prolonged. A probability of the water and oxygen entering the display area along the encapsulation layer 13 is reduced, and a service life of the display panel is improved.

In some embodiments of the present disclosure, referring to FIGS. 1 to 3, the dam 12 includes a pixel defining layer 121 and a supporting layer 122 disposed on a side of the pixel defining layer 121 facing away from the substrate 11. As shown in FIG. 2, the supporting layer 122 includes: a first surface A facing away from the substrate 11, and a second surface B facing towards the substrate 11, and the undulated structure is disposed on the first surface A of the supporting layer 122.

In embodiments of the present disclosure, the undulated structure includes at least one recessed structure and/or at least one protruded structure.

As shown in FIGS. 1 and 2, the dam 12 has the undulated structure on the surface of the dam 12 facing away from the substrate 11. In other words, the supporting layer 122 has the undulated structure on the first surface A of the supporting layer 122 facing away from the substrate 11. The undulated structure of the first surface A includes a plurality of recessed structures 1221 and a plurality of protruded structures 1222, which are arranged at intervals. As shown in FIG. 3, the undulated structure of the first surface A includes a single recessed structure. Of course, the undulated structure of the first surface A may also include a plurality of recessed structures, or the undulated structure of the first surface A may also include a single protruded structure or a plurality of protruded structures.

It is to be noted that the greater the number of the recessed structures and/or the protruded structures is, the greater the actual length of the first surface A of the supporting layer 122 facing away from the substrate 11 is, and also the greater the effective length of the formed encapsulation layer 13 is. Further, the greater the effective length of the formed encapsulation layer 13 is, the less the probability of the water and oxygen entering the display area 22 along the encapsulation layer 13 is.

In embodiment of the present disclosure, the undulated structure has a curve shape or a broken line shape in a width direction of the dam 12. The curve shape may be a wavy shape shown in FIGS. 1 and 2, an arc shape shown in FIG. 3, or any other shapes. The broken line shape may be a sawtooth shape, or any other shapes. Of course, the undulated structure may be a combination of a structure having the curve shape and a structure having the broken line shape in a width direction of the dam 12.

In some embodiments of the present disclosure, as shown in FIGS. 1 and 2, the supporting layer 122 includes a sidewall C, a portion (i.e. a portion 1223 shown in FIG. 2) of the sidewall C adjacent to the first surface A has a preset slope angle θ, and an orthogonal projection of the first surface A on the substrate 11 is located within an orthogonal projection of the second surface B on the substrate 11. In other words, a size d1 of the first surface A is less than a size d2 of the second surface B.

The preset slope angle θ may be less than 90° by setting the size d1 of the first surface A to be less than the size d2 of the second surface B. In an existing display panel, a right angle is formed between a first surface and a sidewall of a supporting layer so that a height difference between a dam and a substrate is large. In this case, an encapsulation layer formed subsequently formed to cover the dam will have a great stress, which is likely to cause the encapsulation layer to crack under the action of an external force. By comparison, in the embodiments of the present disclosure, however, the portion, adjacent to the first surface A, of the sidewall C of the supporting layer 122 has a curved structure with the preset slope angle θ. The formed encapsulation layer 13 has a small stress at the curved structure with the preset slope angle θ, and a height difference between the substrate 11 and the supporting layer 122 of the dam 12 at the curved structure with the preset slope angle θ will be reduced, which further reduces the stress of the formed encapsulation layer 13 and prevents the encapsulation layer 13 from cracking due to too great stress.

In some embodiments of the present disclosure, as shown in FIGS. 1 and 3, a plurality of dam 12 are disposed in the non-display area of the substrate 11, and undulated structures of the plurality of dams 12 have a same shape.

In particular, the recessed structures and/or the protruded structures of the undulated structures of the plurality of dams 12 have a same size, the recessed structures of the undulated structures are arranged at equal intervals, and/or the protruded structures of the undulated structures are also arranged at equal intervals.

In some embodiments of the present disclosure, as shown in FIG. 2, the undulated structure includes: a plurality of recessed structures 1121 arranged at equal intervals d3 and having a same shape; and a plurality of protruded structures 1122 arranged at equal intervals d4 and having a same shape.

In embodiments of the present disclosure, in a direction perpendicular to the substrate 11, the pixel defining layer 121 has a thickness of 1.5 μm to 2 μm, and the supporting layer 122 has a thickness of 1.5 μm to 2 μm. The pixel defining layer 121 and the supporting layer 122 are formed of polyimide (PI).

In some embodiments of the present disclosure, as shown in FIGS. 1 and 3, the at least one dam 12 includes a first dam 12A and a second dam 12B, and the first dam 12A is located between the second dam 12B and the display area 22; and the substrate 11 includes a surface facing away from the dam 12, and in a direction perpendicular to the substrate 11, a distance h1 between the first surface A of the supporting layer 122 of the first dam 12A and the surface of the substrate 11 is less than a distance h2 between the first surface A of the supporting layer 122 of the second dam 12B and the surface of the substrate 11.

It is to be noted that the first dam 12A is the right dam 12 shown in FIGS. 1 and 3, the second dam 12B is the left dam 12 shown in FIGS. 1 and 3, and the display area 22 is located on a side of the first dam 12A facing away from the second dam 12B. The distance h2 is set to be greater than the distance h1. Therefore, when the organic light emitting layer is printed with the liquid organic light emitting material in the display area 22, the second dam 12B could block the liquid organic light emitting material even if the liquid organic light emitting material would overflow the first dam 12A, thereby further preventing the liquid organic light emitting material from overflowing from the display area.

In some embodiments of the present disclosure, as shown in FIGS. 1 and 3, the substrate 11 includes: a base substrate 111, an interlayer dielectric layer 112 disposed on the base substrate 111; a metal layer 113 and a planarization layer 114 which are disposed in a same layer on a side of the interlayer dielectric layer 112 facing away from the base substrate 111; and an anode 115 disposed on a side of the metal layer 113 facing away from the base substrate 111 and partially covering the planarization layer 114. The pixel defining layer 121 of the first dam 12A is located on a side of the anode 115 facing away from the base substrate 111, and the pixel defining layer 121 of the second dam 12B is located on a side of the planarization layer 114 and the anode 115 facing away from the base substrate 111.

The base substrate 111 may be made of a glass or polyimide (PI). The interlayer dielectric layer 112 may be formed of SiOx, SiNx, SiON, AlOx, HfOx, TaOx, or the like. The metal layer 113 may be a multilayer structure in which a Ti layer, an Al layer, and a Ti layer are stacked in sequence. The planarization layer 114 is formed of polyimide (PI). The anode 115 may be a multilayer structure in which an ITO layer, an Ag layer, and an ITO layer are stacked in sequence. The anode 115 is a multilayer structure including a lower film of ITO (Indium Tin Oxide), an upper film of ITO, and an intermediate film of Ag.

In some embodiments of the present disclosure, as shown in FIGS. 1 and 3, the encapsulation layer 13 includes at least one inorganic film. As shown in FIGS. 1 and 3, the encapsulation layer 13 includes two inorganic films, which are a first inorganic film 131 and a second inorganic film 132, respectively. The first inorganic film 131 covers the substrate 11 and the dam 12, and the second inorganic film 132 covers the first inorganic film 131. The number of the inorganic films of the encapsulation layer 13 is not limited to two, but may be three or the like.

The inorganic film is formed of silicon nitride, silicon oxide, aluminum oxide, or the like. The inorganic film covering the substrate 11 and the dam 12 may be formed by a chemical vapor deposition process.

In the embodiments of the present disclosure, the substrate includes a display area and a non-display area around the display area. At least one dam is disposed in the non-display area of the substrate and the dam has an undulated structure on a surface of the dam facing away from the substrate, and an encapsulation layer is disposed on a side of the dam facing away from the substrate. Since the dam has the undulated structure on the surface of the dam facing away from the substrate, the formed encapsulation layer 13 has an increased effective length. Thereby, the path to be eroded by water and oxygen can be prolonged and the probability of the water and oxygen entering the display area along the encapsulation layer is reduced, and the service life of the display panel is improved.

Figure 4:
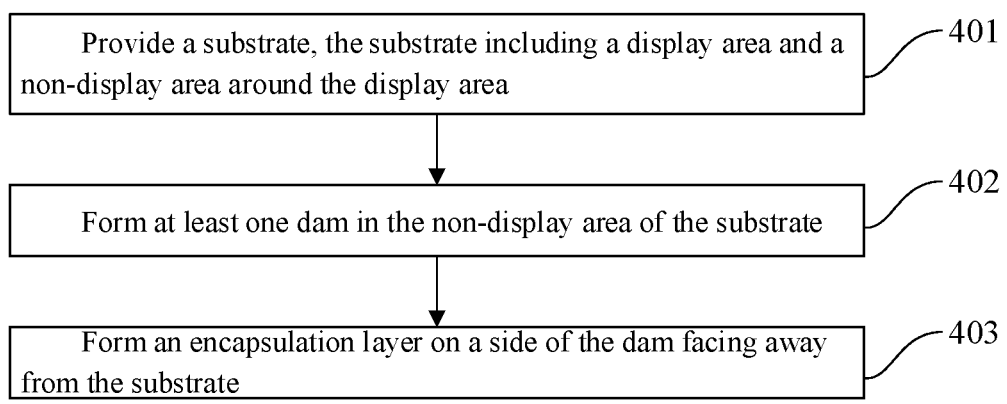
FIG. 4 is a flow diagram showing a method of manufacturing a display panel according to embodiments of the present disclosure.

Referring to FIG. 4, a flow diagram showing a method of manufacturing a display panel according to embodiments of the present disclosure is shown. The method may specifically include the following steps.

In a step 401, a substrate is provided. The substrate includes a display area 22 and a non-display area 21 around the display area 22.

Figure 5:
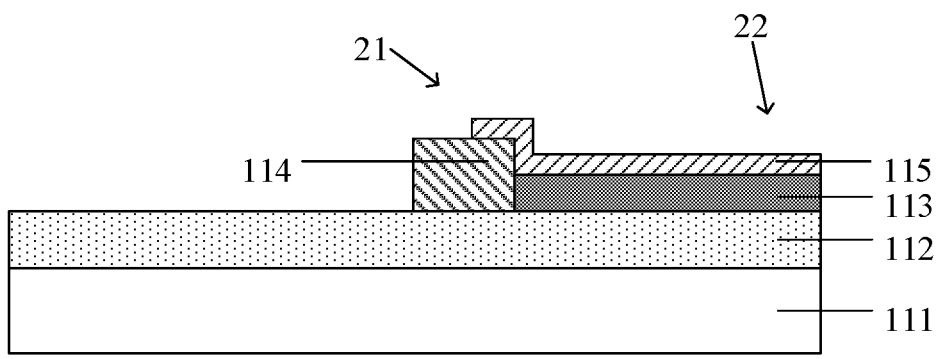
FIG. 5 is a schematic view showing a structure of a substrate according to an embodiment of the present disclosure.

In embodiment of the present disclosure, when a display panel is manufactured, firstly a substrate 11 needs to be provided. As shown in FIG. 5, the substrate 11 includes: a base substrate 111, an interlayer dielectric layer 112 disposed on the base substrate 111; a metal layer 113 and a planarization layer 114 which are disposed in a same layer on a side of the interlayer dielectric layer 112 facing away from the base substrate 111; and an anode 115 disposed on a side of the metal layer 113 facing away from the base substrate 111 and partially covering the planarization layer 114.

In some embodiments of the present disclosure, firstly an interlayer dielectric layer 112 is formed on a base substrate 111 by a chemical vapor deposition (CVD) process or any other processes. Then, a metal layer 113 is formed on a side of the interlayer dielectric layer 112 facing away from the base substrate 111 by a process such as sputtering. Next, a polyimide film is applied on a side of the interlayer dielectric layer 112 facing away from the base substrate 111, and a planarization layer 114 is formed on the side of the interlayer dielectric layer 112 facing away from the base substrate 111 by processes such as an exposing process or a developing process. Finally, an anode 115 is formed by a process such as sputtering. The anode 115 is disposed on a side of the metal layer 113 facing away from the base substrate 111 and partially covers the planarization layer 114.

Of course, the substrate includes the display area and the non-display area around the display area, but in the substrate shown in FIG. 5, structures of films and/or layers in the non-display area are mainly illustrated, and the substrate further includes other films and/or layers, such as a gate electrode layer, in the display area.

In a step 402, at least one dam 12 is formed in the non-display area 21 of the substrate 11.

In the embodiments of the present disclosure, the at least one dam 12 is formed in the non-display area 21 of the substrate 11 and the dam 12 has the undulated structure on the surface of the dam 12 facing away from the substrate 11, which increases an actual length of the surface of the dam 12 facing away from the substrate 11.

The dam 12 includes a pixel defining layer 121 and a supporting layer 122 disposed on a side of the pixel defining layer 121 facing away from the substrate 11.

The step 402 specifically includes: forming the pixel defining layer 121 in the non-display area 21 of the substrate 11; and forming the supporting layer 122 on the side of the pixel defining layer 121 facing away from the substrate 11. The supporting layer 122 includes: a first surface facing away from the substrate 11, and a second surface facing towards the substrate 11, and the undulated structure is disposed on the first surface of the supporting layer 122.

Figure 6:
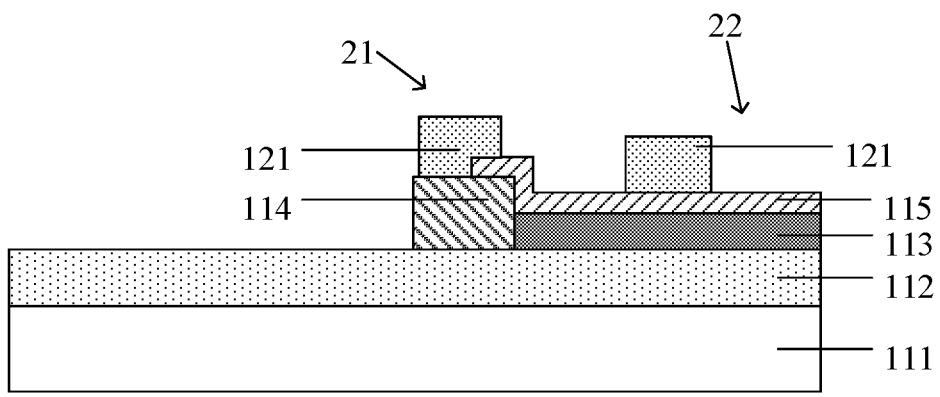
FIG. 6 is a schematic view showing a structure of a pixel defining layer formed in a non-display area of the substrate according to an embodiment of the present disclosure.

As shown in FIG. 6, a film for the pixel defining layer is applied to the substrate 11. The film for the pixel defining layer covers the non-display area 22. Specifically, the film for the pixel defining layer covers the planarization layer 114 and the anode 115 of the substrate 11. Then, the pixel defining layer 121 is formed by processes such as an exposing process or a developing process.

Figure 7:
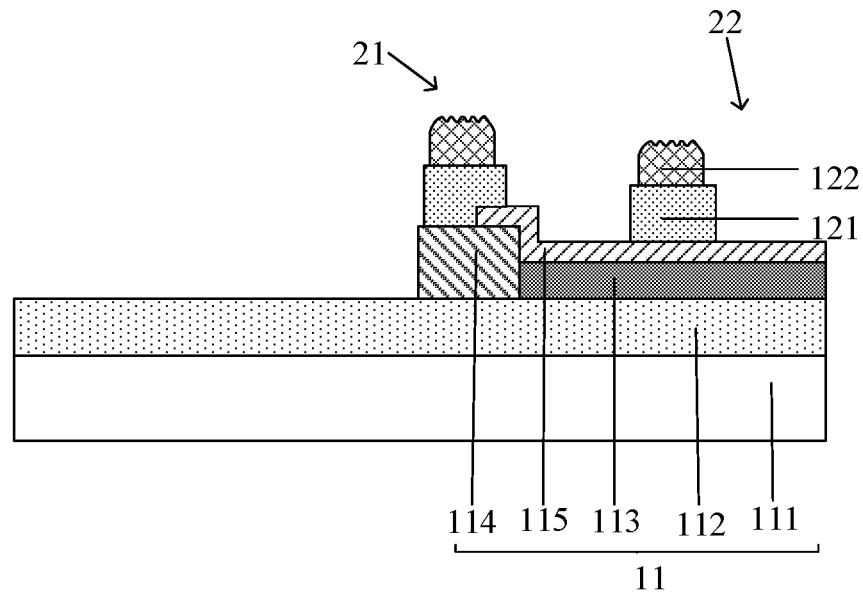
FIG. 7 is a schematic view showing a structure of a supporting layer formed on the pixel defining layer according to an embodiment of the present disclosure.
Figure 8:
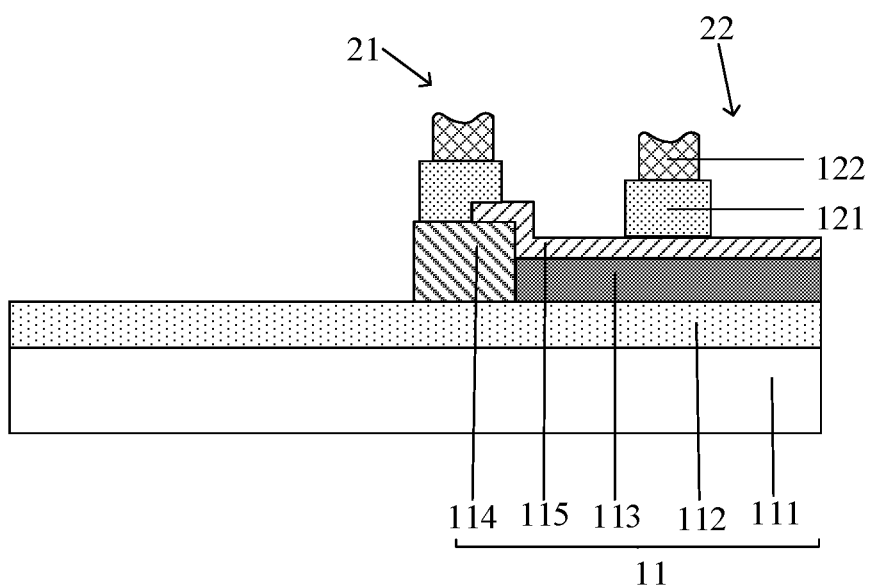
FIG. 8 is a schematic view showing a structure of a supporting layer formed on the pixel defining layer according to another embodiment of the present disclosure.

As shown in FIGS. 7 and 8, the supporting layer 122 is formed on the side of the pixel defining layer 121 facing away from the substrate 11. The pixel defining layer 121 and the supporting layer 122 constitute the dam 13 together, and the first surface A of the supporting layer 122 facing away from the substrate 11 specifically has the undulated structure of the dam 12.

In some embodiments of the present disclosure, a film for the supporting layer is formed on the side of the pixel defining layer 121 facing away from the substrate 11, and the film for the supporting layer is patterned with a half-tone mask to obtain the supporting layer 122. The supporting layer 122 includes a sidewall, a portion of the sidewall adjacent to the first surface has a preset slope angle, and an orthogonal projection of the first surface on the substrate 11 is located within an orthogonal projection of the second surface on the substrate 11.

In some embodiments of the present disclosure, firstly, a film for the supporting layer is applied to the pixel defining layer 121. After that, the film for the supporting layer is exposed with a half-tone mask and then is developed. Finally, the remaining impurities are removed to obtain the supporting layer 122.

The half-tone mask has different transmittances in different positions, which can ensure that the first surface A of the supporting layer 122 is formed with the undulated structure as shown in FIG. 7 or 8.

In a step 403, an encapsulation layer 13 is formed on a side of the dam 12 facing away from the substrate 11.

In the embodiments of the present disclosure, the encapsulation layer 13 is formed on the side of the dam 12 facing away from the substrate 11, and the encapsulation layer 13 includes at least one inorganic film, thereby obtaining the display panel as shown in FIG. 1 or 3. Since the dam 12 has the undulated structure on the surface of the dam 12 facing away from the substrate 11, which increases an actual length of the surface of the dam 12 facing away from the substrate 11. Thereby, the encapsulation layer 13 formed on the side of the dam 12 facing away from the substrate 11 also has an increased effective length.

It is to be noted that the display panel as shown in FIG. 1 may be obtained by forming the encapsulation layer 13 on the side of the dam 12 shown in FIG. 7 facing away from the substrate 11, and the display panel as shown in FIG. 3 may be obtained by forming the encapsulation layer 13 on the side of the dam 12 shown in FIG. 8 facing away from the substrate 11.

In the embodiments of the present disclosure, the substrate is provided. The substrate includes the display area and the non-display area around the display area. At least one dam is formed in the non-display area of the substrate. The encapsulation layer is formed on the side of the dam facing away from the substrate. The dam has the undulated structure on the surface of the dam facing away from the substrate. Since the dam has the undulated structure on the surface of the dam facing away from the substrate, the formed encapsulation layer 13 has an increased effective length. Thereby, the path to be eroded by water and oxygen can be prolonged, and thus the probability of the water and oxygen entering the display area along the encapsulation layer is reduced, and the service life of the display panel is improved.

Embodiments of the present disclosure further provide a display apparatus including the above display panel.

The display apparatus may be an OLED display apparatus. The OLED display apparatus may include any products or parts having a displaying function, such as a mobile phone, a tablet computer, a TV, a display, a notebook computer, a digital frame, and a navigator.

The description in the above embodiments may be referred to for a specific description of the display panel and the display panel is no longer described for the sake of brevity.

In the embodiments of the present disclosure, the display apparatus includes the display panel, and the display panel includes the substrate. The substrate includes the display area and the non-display area around the display area. At least one dam is disposed in the non-display area of the substrate and the dam has the undulated structure on the surface of the dam facing away from the substrate, and the encapsulation layer is disposed on the side of the dam facing away from the substrate. Since the dam has the undulated structure on the surface of the dam facing away from the substrate, the formed encapsulation layer 13 has an increased effective length. Thereby, the path to be eroded by water and oxygen is prolonged. The probability of the water and oxygen entering the display area along the encapsulation layer is reduced, and the service life of the display panel is improved.

For the foregoing method embodiments, for the sake of simple description, they are all expressed as a series of action combinations, but those skilled in the art should know that the present disclosure is not limited by the order of actions described, because according to the present disclosure, some steps may be performed in other orders or simultaneously. Further, those skilled in the art should also know that the embodiments described in the specification belong to specific embodiments, and the actions and modules involved are not necessarily required by the present disclosure.

Each embodiment of the description is described in a progressive manner. The contents mainly described in each embodiment are different from those mainly described in other embodiments. For contents that are not described in an embodiment, those described in another embodiment may be referred to.

Finally, it should also be noted that in the present disclosure, relational terms such as "first" and "second" are used only to distinguish an entity or operation from another entity or operation, and do not necessarily require or imply that there is any such actual relation or sequence between these entities or operations. Moreover, the terms "include", "comprise" or any other variant thereof are intended to cover non-exclusive inclusion, so that a process, method, commodity or equipment that includes a series of elements includes not only those elements, but also other elements that are not explicitly listed, or elements that are inherent to the process, method, commodity, or equipment. Unless explicitly stated and defined otherwise, an element defined by an expression such as "includes a . . . ", "including a . . . " or "comprises a", does not exclude that there are also other identical elements in a process, method, commodity, or equipment that includes the element.

The display panel, the method of manufacturing the display panel, and the display apparatus according to the embodiments of the present disclosure have been described in detail above. Specific examples have been used in the present disclosure to explain the principles and implementations of the present disclosure. The descriptions of the above embodiments are only used to fabricate understanding of the methods and inventive concepts of the present disclosure. At the same time, those skilled in the art can make any changes and modifications to the embodiments and application ranges according to the inventive concepts of the present disclosure. In summary, the content of this specification should not be construed as limiting the present disclosure.

What is claimed is:
1. A display panel comprising:
a substrate comprising a display area and a non-display area around the display area;
at least one dam disposed in the non-display area of the substrate and having an undulated structure on a surface of the dam facing away from the substrate; and
an encapsulation layer disposed on a side of the dam facing away from the substrate,
wherein the undulated structure comprises at least one recessed structure and at least one protruded structure; and
the dam comprises a pixel defining layer and a supporting layer disposed on a side of the pixel defining layer facing away from the substrate, wherein the supporting layer comprises: a first surface facing away from the substrate, and a second surface facing towards the substrate, and the undulated structure is disposed on the first surface of the supporting layer; and wherein the supporting layer comprises a sidewall, an orthogonal projection of the first surface on the substrate is located within an orthogonal projection of the second surface on the substrate, and the sidewall of the supporting layer has a curved structure, wherein
a distance of the curved structure from bottom to top along a thickness direction of the supporting layer is larger than a depth from a valley of the at least one recessed structure to an adjacent peak of the at least one protruded structure along the thickness direction of the supporting layer, and a distance of the curved structure from one side of the curve structure to a peak of the curve structure along a direction perpendicular to the thickness direction of the supporting layer is larger than a distance from the valley of the at least one recessed structure to the adjacent peak of the at least one protruded structure along the direction perpendicular to the thickness direction of the supporting layer.

2. The display panel of claim 1, wherein:
the undulated structure has a curve shape or a broken line shape in a width direction of the dam.

3. The display panel of claim 1, wherein:
the supporting layer has a thickness of 1.5 μm to 2 μm in a direction perpendicular to the substrate.

4. The display panel of claim 1, wherein:
the at least one dam comprises a first dam and a second dam, and the first dam is located between the second dam and the display area; and
the substrate comprises a surface facing away from the at least one dam, and in a direction perpendicular to the substrate, and a distance between the first surface of the supporting layer of the first dam and the surface of the substrate is less than a distance between the first surface of the supporting layer of the second dam and the surface of the substrate.

5. The display panel of claim 4, wherein:
the substrate comprises: a base substrate, an interlayer dielectric layer disposed on the base substrate; a metal layer and a planarization layer which are disposed in a same layer on a side of the interlayer dielectric layer facing away from the base substrate; and an anode disposed on a side of the metal layer facing away from the base substrate and partially covering the planarization layer; and
the pixel defining layer of the first dam is located on a side of the anode facing away from the base substrate, and the pixel defining layer of the second dam is located on a side of the planarization layer and the anode facing away from the base substrate.

6. The display panel of claim 1, wherein:
the at least one dam comprises a plurality of dam disposed in the non-display area of the substrate, and undulated structures of the plurality of dams have a same shape.

7. The display panel of claim 1, wherein:
the undulated structure comprises: a plurality of recessed structures arranged at equal intervals and having a same shape; and a plurality of protruded structures arranged at equal intervals and having a same shape.

8. The display panel of claim 1, wherein:
the encapsulation layer comprises at least one inorganic film.

9. The display panel of claim 1, wherein:
the at least one dam defines a plurality of pixels arranged in an array and located in the display area for displaying an image.

10. A method of manufacturing a display panel, the method comprising:
providing a substrate, the substrate comprising a display area and a non-display area around the display area;
forming at least one dam in the non-display area of the substrate, the dam having an undulated structure on a surface of the dam facing away from the substrate; and
forming an encapsulation layer on a side of the dam facing away from the substrate,
wherein the undulated structure comprises at least one recessed structure and at least one protruded structure; and
the dam comprises a pixel defining layer and a supporting layer, forming the at least one dam in the non-display area of the substrate comprises:
forming the pixel defining layer in the non-display area of the substrate; and
forming the supporting layer on a side of the pixel defining layer facing away from the substrate, and
the supporting layer comprises: a first surface facing away from the substrate, and a second surface facing towards the substrate, and the undulated structure is disposed on the first surface of the supporting layer, wherein the supporting layer comprises a sidewall, an orthogonal projection of the first surface on the substrate is located within an orthogonal projection of the second surface on the substrate, and the sidewall of the supporting layer has a curved structure, wherein a distance of the curved structure from bottom to top along a thickness direction of the supporting layer is larger than a depth from a valley of the at least one recessed structure to an adjacent peak of the at least one protruded structure along the thickness direction of the supporting layer, and a distance of the curved structure from one side of the curve structure to a peak of the curve structure along a direction perpendicular to the thickness direction of the supporting layer is larger than a distance from the valley of the at least one recessed structure to the adjacent peak of the at least one protruded structure along the direction perpendicular to the thickness direction of the supporting layer.

11. The method of claim 10, wherein
forming the supporting layer on the side of the pixel defining layer facing away from the substrate comprises:
forming a film for the supporting layer on the side of the pixel defining layer facing away from the substrate, and
patterning the film for the supporting layer with a half-tone mask to obtain the supporting layer.

12. The method of claim 10, wherein
the undulated structure has a curve shape or a broken line shape in a width direction of the dam.

13. A display apparatus comprising the display panel of claim 1.

* * * * *